United States Patent
Hashimoto

(10) Patent No.: US 11,692,688 B2
(45) Date of Patent: *Jul. 4, 2023

(54) LIGHT EMITTING MODULE, SURFACE LIGHT SOURCE, AND A METHOD OF MANUFACTURING LIGHT EMITTING MODULE

(71) Applicant: NICHIA CORPORATION, Anan (JP)

(72) Inventor: Toru Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/813,308

(22) Filed: Jul. 18, 2022

(65) Prior Publication Data
US 2022/0349555 A1 Nov. 3, 2022

Related U.S. Application Data

(63) Continuation of application No. 17/163,516, filed on Jan. 31, 2021, now Pat. No. 11,421,856.

(30) Foreign Application Priority Data

Jan. 31, 2020 (JP) .................................. 2020-015670

(51) Int. Cl.
*F21V 9/40* (2018.01)
*G02F 1/13357* (2006.01)
*F21V 8/00* (2006.01)

(52) U.S. Cl.
CPC .............. *F21V 9/40* (2018.02); *G02B 6/0021* (2013.01); *G02B 6/0073* (2013.01);
(Continued)

(58) Field of Classification Search
CPC ......... G02B 6/002–0021; H01L 25/075–0753; G02F 1/1336–133613
See application file for complete search history.

(56) References Cited

U.S. PATENT DOCUMENTS 8,301,002 B2 10/2012 Shani
9,678,383 B1 6/2017 Peterson et al.
(Continued)

FOREIGN PATENT DOCUMENTS

JP 2007227286 A 9/2007
JP 2008503034 A 1/2008
(Continued)

OTHER PUBLICATIONS

"Non-Final Office Action, issued from the United States Patent and Trademark Office, to U.S. Appl. No. 17/163,516 dated Sep. 28, 2021, 10 pages."
(Continued)

*Primary Examiner* — Mariceli Santiago
(74) *Attorney, Agent, or Firm* — Hunton Andrews Kurth LLP

(57) ABSTRACT

A light emitting module includes at least one light source, a light guide member having a demarcating groove configured to demarcate at least one light emitting region, and at least one light source arrangement part located in each of the at least one light emitting region and accommodating a light source, a first light-reflecting member disposed in the demarcating groove, and a wavelength converting member covering an upper surface of the light guide member.

21 Claims, 9 Drawing Sheets

FIG. 2

(52) U.S. Cl.
CPC .. *G02F 1/133603* (2013.01); *G02F 1/133606* (2013.01); *F21V 2200/15* (2015.01)

(56) References Cited

U.S. PATENT DOCUMENTS

| | | | |
|---|---|---|---|
| 11,421,856 B2* | 8/2022 | Hashimoto | G02B 6/0068 |
| 2005/0265029 A1 | 12/2005 | Epstein et al. | |
| 2009/0086508 A1 | 4/2009 | Bierhuizen | |
| 2011/0037740 A1 | 2/2011 | Yamaguchi | |
| 2011/0194034 A1 | 8/2011 | Shimizu | |
| 2019/0324184 A1 | 10/2019 | Cai et al. | |
| 2020/0049877 A1 | 2/2020 | Watanabe et al. | |

FOREIGN PATENT DOCUMENTS

| | | |
|---|---|---|
| JP | 2008059786 A | 3/2008 |
| JP | 2010008837 A | 1/2010 |
| JP | 2010541154 A | 12/2010 |
| JP | 2018101521 A | 6/2018 |
| JP | 2019513300 A | 5/2019 |
| JP | 2020009556 A | 1/2020 |
| JP | 2020013714 A | 1/2020 |
| KR | 20090117419 A | 11/2009 |
| WO | 2010058625 A1 | 5/2010 |
| WO | 2010070885 A1 | 6/2010 |
| WO | 2018116815 A1 | 6/2018 |

OTHER PUBLICATIONS

"Notice of Allowance, United States Patent and Trademark Office, issued to U.S. Appl. No. 17/163,516 dated Apr. 19, 2022, 8 pages."

* cited by examiner

LIGHT EMITTING MODULE, SURFACE LIGHT SOURCE, AND A METHOD OF MANUFACTURING LIGHT EMITTING MODULE

CROSS-REFERENCE TO RELATED PATENT APPLICATION

This is a continuation application of U.S. patent application Ser. No. 17/163,516, filed Jan. 31, 2021, which claims priority under 35 U. S. C. § 119 to Japanese Patent Application No. 2020-015670, filed Jan. 31, 2020, the contents of which all are hereby incorporated by reference in their entireties.

BACKGROUND

Technical Field

The present disclosure relates to a light emitting module, a surface light source, and a method of manufacturing the light emitting module.

Description of Related Art

Light-emitting modules that employ a combination of a light source and a light-guide member are widely used for surface light sources such as backlight of LCD displays. (For example, see JP 2008-59786A.)

SUMMARY

There has been a demand for dividing a light emitting module into a plurality of light-emitting regions to individually control the light emitted from each of the light-emitting regions.

Accordingly, it is an object of certain embodiments of the present disclosure to provide a light emitting module in which light emitted from each of at least one light emitting region can be individually controlled, and to provide a surface light source having such a light emitting module, and a method of manufacturing such a light emitting module.

A light emitting module according to certain embodiments of the present disclosure includes: at least one first light source; a light guide member including a demarcating groove configured to demarcate at least one first light emitting region, and at least one first light source arrangement part provided in the at least one first light emitting region and accommodating a corresponding one of the at least one first light source; a light-reflecting member disposed in the demarcating groove; and a wavelength converting member covering an upper surface of the light guide member.

A surface light source according to certain embodiments of the present disclosure includes the light emitting module and a wiring substrate. The light guide member is disposed on the wiring substrate, and the at least one first light source is mounted on the wiring substrate.

A method of manufacturing a light emitting module according to certain embodiments of the present disclosure includes: providing an intermediate body including a light guide member provided with at least one first light source arrangement part and at least one first light source accommodated in a corresponding one of the at least one first light source arrangement part; forming a demarcating groove in an upper surface of the light guide member, the demarcating groove being configured to demarcate at least one first light emitting region provided with a corresponding one of the at least one first light source arrangement part; disposing a light-reflecting member in the demarcating groove; and disposing a wavelength converting member to cover the light guide member.

According to certain embodiments of the present disclosure, a light emitting module in which light emitted from each light-emitting region can be individually controlled, a surface light source having such a light emitting module, and a method of manufacturing such a light emitting module can be realized.

DETAILED DESCRIPTION

Figure 1:
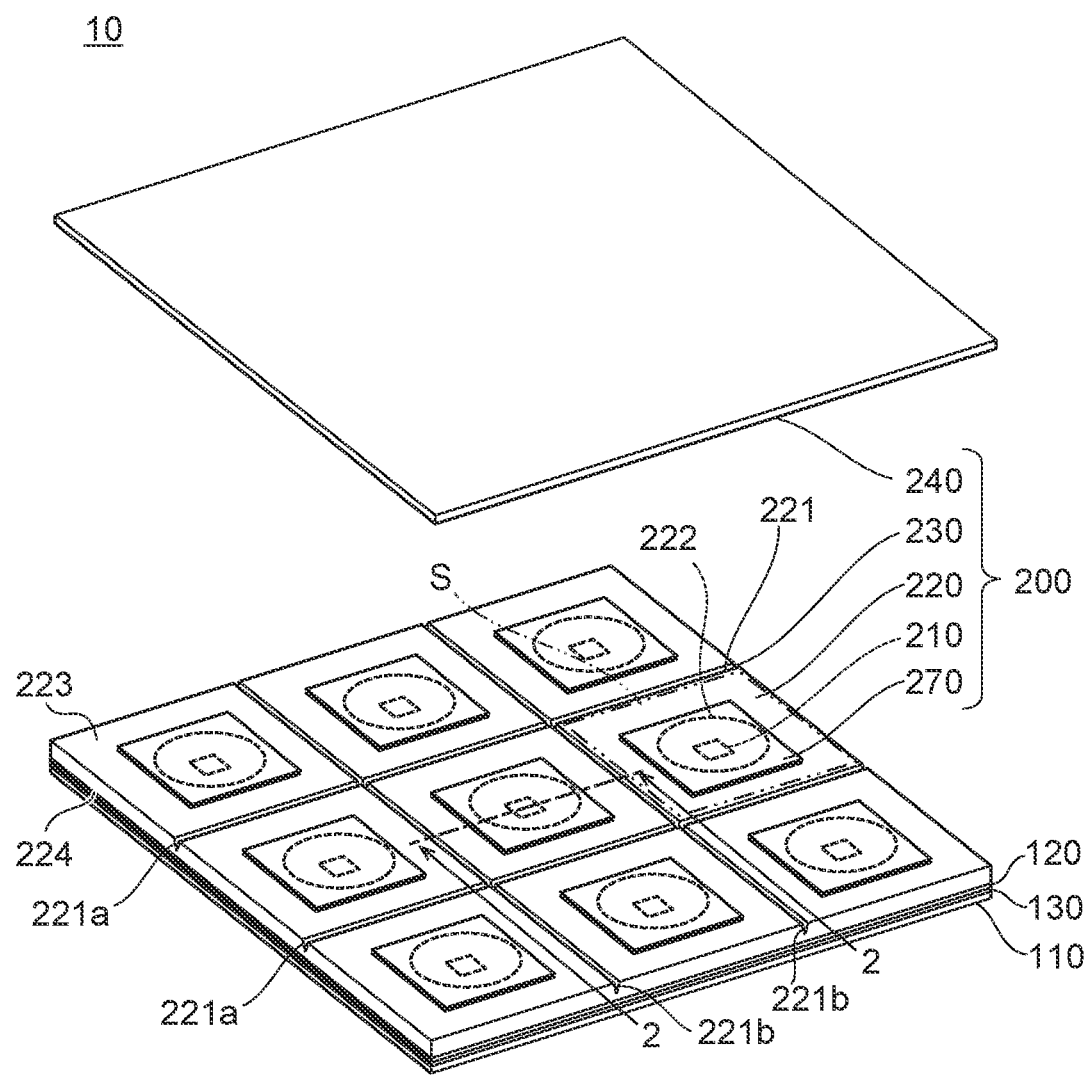
FIG. 1 is an exploded perspective view schematically illustrating a surface light source having a light emitting module according to an embodiment of the present disclosure.

For the purposes of the explanation, a XYZ orthogonal coordinate system will be adopted in the present specification. For example, as shown in FIG. 1, a direction from the light guide member 220 to the wavelength converter 240 will be referred to a "Z-direction". The Z-direction may also be referred to as an "upward direction". A direction opposite to the Z-direction may also be referred to as "downward direction". The Z-direction may also be referred to as a "thickness direction". One direction perpendicular to the Z-direction will be referred to as a "X-direction". In addition, one direction perpendicular to the Z-direction and the X-directions will be referred to as a "Y-direction".

Figure 2:
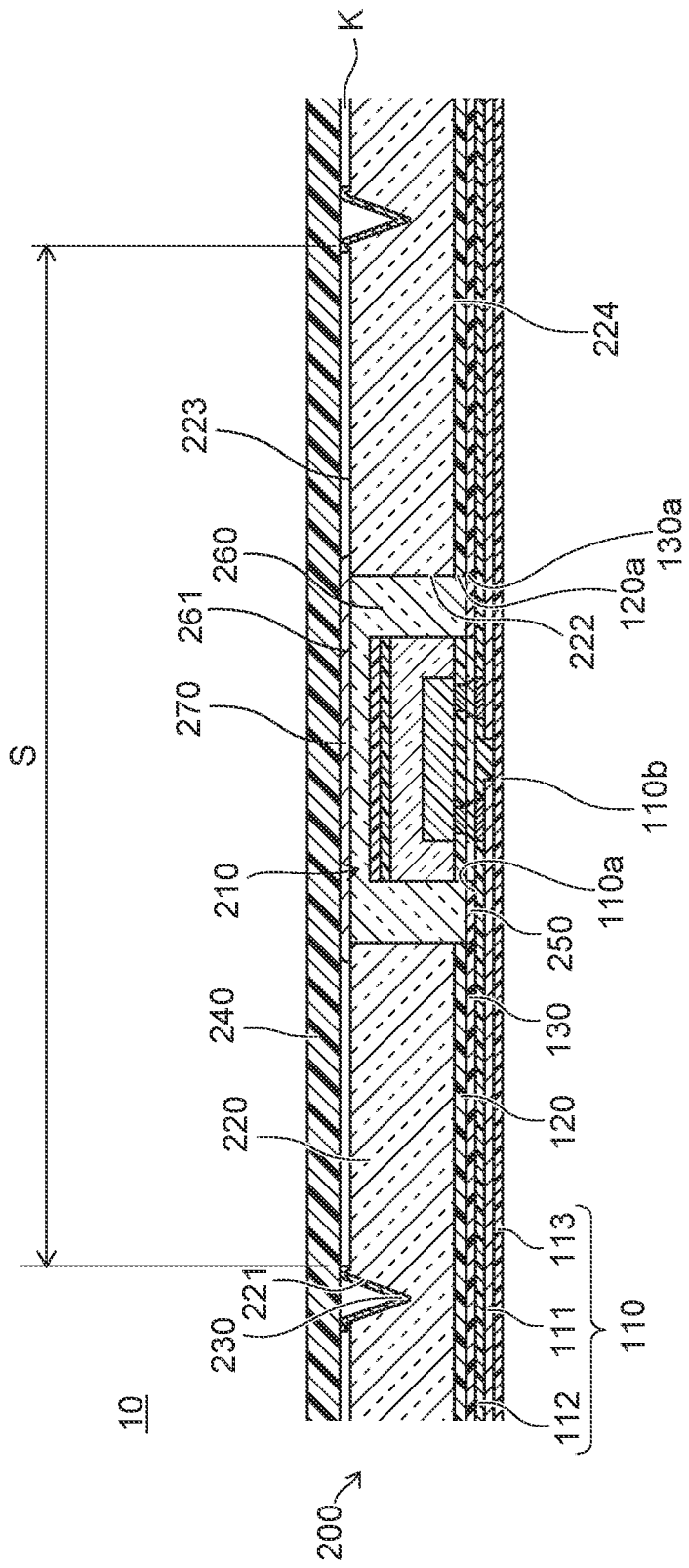
FIG. 2 is a schematic cross-sectional view taken along line 2-2 of FIG. 1.

FIG. 1 is an exploded perspective view schematically illustrating a surface light source having a light emitting module according to an embodiment of the present disclosure. FIG. 2 is a schematic cross-sectional view taken along line 2-2 of FIG. 1. The surface light source 10 includes, for example, a wiring substrate 110, a light-reflecting sheet 120, an adhesive sheet 130, and a light emitting module 200.

The light emitting module 200 includes, for example, a plurality of light sources 210, a light guide member 220, a first light-reflecting member 230, and a wavelength converting member 240. The light guide member 220 includes demarcating groove 221 configured to demarcate light emitting regions S, and a light source arrangement parts 222 located within each of the light emitting regions S and accommodating a corresponding one of the light sources 210. The first light-reflecting member 230 is disposed in the demarcating groove 221. The wavelength converting member 240 covers an upper surface 223 of the light guide member 220. Each component of the surface light source 10 will be described in detail below.

The wiring substrate 110 may be a plate-shaped member with a rectangular shape in a top view. The shape of the wiring substrate 110 can be appropriately determined. As shown in FIG. 2, the wiring substrate 110 includes, for example, a wiring layer 111, a first covering layer 112 made of a resin material and covering an upper surface of the wiring layer 111, and a second covering layer 113 made of a resin material and covering a lower surface of the wiring layer 111. FIG. 2 shows an example where a single wiring layer 111 is disposed, but a plurality of wiring layers 111 may be disposed in the Z-direction between the first covering layer 112 and the second covering layer 113. In addition, when a plurality of wiring layers 111 are disposed in the Z-direction, an insulating layer and an adhesive layer may be provided between the two wiring layers 111 adjacent in the Z-direction.

The surfaces of the wiring substrate 110 includes an upper surface 110a and a lower surface 110b. The upper surface 110a and the lower surface 110b are, for example, flat surfaces and are substantially in parallel to the X- and Y-directions.

A light guide member 220 is disposed above the wiring substrate 110. A light-reflecting sheet 120 is disposed between the wiring substrate 110 and the light guide member 220. The light-reflecting sheet 120 is configured to reflect a portion of light emitted from the plurality of the light sources 210. For the light-reflecting sheet 120, a resin sheet that contains a large number of foams (for example, a foamed resin sheet), a resin sheet that contains a light diffusing material, or the like can be used. Examples of the resin used for the light-reflecting sheet 120 include thermoplastic resins such as acrylic resin, polycarbonate resin, cyclic polyolefin resin, polyethylene terephthalate resin, or polyester resin, or thermosetting resins such as epoxy resin or silicone resin. Examples of materials used for the light diffusing material include known materials such as titanium oxide, silica, alumina, zinc oxide or glass.

There may be an adhesive sheet 130 disposed between the wiring substrate 110 and the light-reflecting sheet 120. The adhesive sheet 130 adheres the wiring substrate 110 and the light-reflecting sheet 120.

A light-reflecting layer that is light-reflective to the light emitted from the light sources 210 may be further disposed on the upper surface of the wiring substrate 110. In this case, the adhesive sheet 130 is adhered to the light-reflecting layer. The light-reflecting layer may be extended into the light source arrangement part 222 of the light guide member 220 in a top view. It is more preferable that the light-reflecting layer is extended overlapping with the light sources 210 in the top view, that is, extended to locations between the light sources 210 and the wiring substrate 110. With this arrangement, a reduction in the luminance around the light sources 210 due to portions of light emitted from the light sources 210 being absorbed by the wiring substrate 110 can be reduced. Examples of materials used for the light-reflecting layer include resins containing light diffusing materials made of known materials such as titanium oxide, silica, alumina, zinc oxide or glass. Examples of the resins used for the light-reflecting layer include thermoplastic resins or thermosetting resins as used for light-reflecting sheet 120. Ultraviolet-curing resin may also be used as a resin for the light-reflecting layer.

The light-reflecting sheet 120 is formed with a plurality of through-holes 120a at locations overlapping with the plurality of light source arrangement parts 222 located on the light guide member 220 in the top view. Similarly, the adhesive sheet 130 is formed with a plurality of through-holes 130a at locations overlapping with the plurality of light source arrangement parts 222 located on the light guide member 220 in the top view.

The light guide member 220 is permeable to light emitted from the light sources 210. Examples of the material of the light guide member 220 include thermoplastic resins such as acrylic resin, polycarbonate resin, cyclic polyolefin resin, polyethylene terephthalate resin, or polyester resin, or thermosetting resins such as epoxy resin or silicone resin, or glass.

As shown in FIG. 1, the light guide member 220 may be, for example, a plate-like member. For the light guide member 220, a flexible member may be employed. The light guide member 220 may have a single layer structure or a multilayer structure. When the light guide material 220 has a multilayer structure, adhesive sheets may be provided between the layers to adhere. For such an adhesive sheet, a material having permeability to light emitted from the light sources 210 is preferably used, and further, in order to avoid creation of interfaces between the layers, the same material used for the light guide member 220 is preferably used. The light guide member 220 may have a substantially rectangular shape in a top plan view, but the shape of the light guide member 220 can be appropriately determined. The light guide member 220 has surfaces including an upper surface 223 facing the wavelength converting member 240 and a lower surface 224 located at an opposite side to the upper surface 223. The lower surface 224 is, for example, a flat surface, and is substantially in parallel to the upper surface 110a of the wiring substrate 110.

The upper surface 223 of the light guide member 220 may be formed with demarcating groove 221. Accordingly, the upper surface 223 is demarcated into a plurality of light emitting regions S by the demarcating groove 221. Each of the light-emitting regions S has a light source arrangement part 222 in a top plan view. Thus, the luminous regions S refers to two-dimensional regions demarcated by the demarcating groove 221.

The demarcating groove 221 may be formed in a lattice shape. The demarcating groove 221 may include a plurality of first demarcating grooves 221a extending in an X-direction and a plurality of second demarcating grooves 221b extending in a Y-direction. The first demarcating grooves 221a and the second demarcating grooves 221b may intersect. Each of the luminous regions S may have a substantially rectangular shape in a top plan view. The demarcating groove 221 does not have to be formed in a lattice shape, and the light-emitting regions S do not have to be formed in a substantially rectangular shape. For example, the demarcating groove 221 may be formed such that each of the light-emitting regions S has a polygonal shape such as a triangular shape or a hexagonal shape. Moreover, the light-emitting regions S may be aligned in a row in the X- or Y-direction with the demarcating groove 221 between each of the light-emitting regions S. Further, the first demarcating grooves 221a do not have to be continuously extended in the X-direction, and the second demarcating grooves 221b do not have to be continuously extended in the Y-direction.

In this way, the demarcating groove 221 is located between at least two adjacent light source arrangement parts 222 (i.e., between a first light source arrangement part having a first light source disposed therein and is located within a first light-emitting region and a second light source arrangement part having a second light source disposed therein and is located within a second light-emitting region that is adjacent to the first light-emitting region). The light source arrangement parts 222 adjacent to the other light source arrangement parts 222 in the X- and Y-directions are surrounded by the demarcating groove 221.

Figure 3:
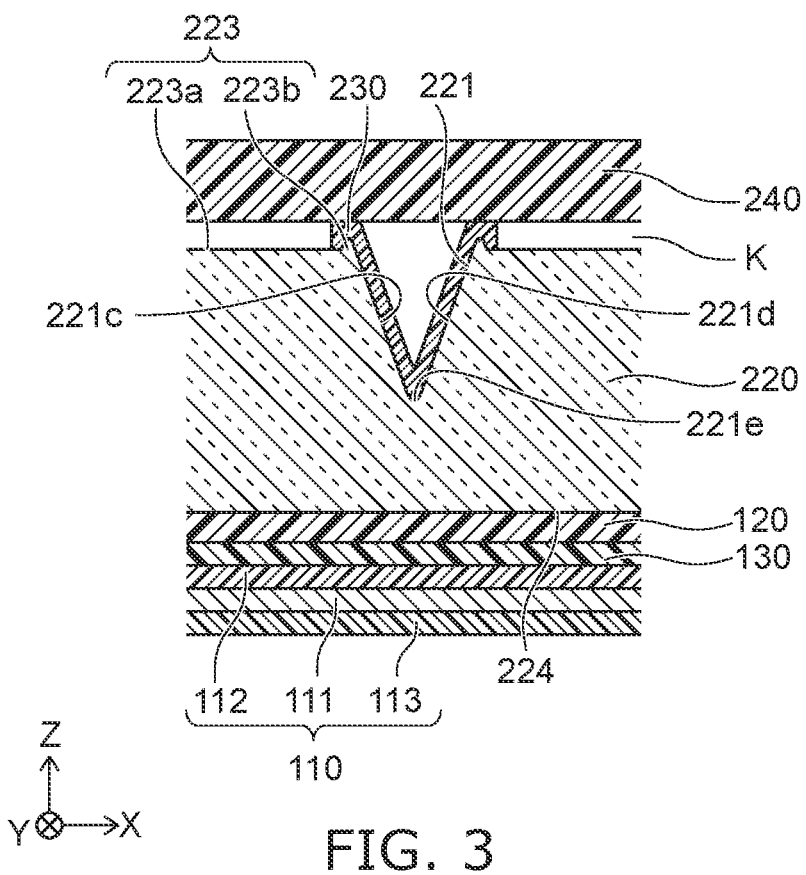
FIG. 3 is a cross-sectional view schematically showing an enlarged view of the demarcating groove and the portion around the demarcating groove shown in FIG. 2.

FIG. 3 is a partial cross-sectional view showing an enlarged view of the demarcating groove and the portion around the demarcating groove shown in FIG. 2. As shown in FIG. 3, the demarcating groove 221 is a recess provided in the upper surface 223 of the light guide member 220. The demarcating groove 221 opens to at least the upper surface 223 of the light guide member 220. The demarcating groove 221 can be defined in a substantially V-shape in cross section. The demarcating groove 221 is defined by two lateral surfaces 221c and 221d and a lower surface 221e located between the two lateral surfaces 221c and 221d. The two lateral surfaces 221c and 221d are inclined with respect to the Z-direction and tapering toward the lower surface 221e. But the sectional shape of to the demarcating groove 221 can be appropriately determined. For example, the two lateral surfaces 221c and 221d may be parallel to the Z-direction. Also, the lower surface 221e can be a curved face with a small curvature, but it can be a flat surface.

The upper surface 223 of the light guide member 220 includes a plurality of flat portions 223a and a plurality of protruding portions 223b located along edges of the demarcating groove 221 and protruding above the flat portion 223a. The flat portions 223a are, for example, substantially in parallel to the upper surface 110a of the wiring substrate 110. The protruding portions 223b are located between the flat portions 223a and the lateral surfaces 221c and 221d defining the demarcating groove 221. The upper surfaces 223 of the light guide member 220 may not be provided with the protruding portions 223b.

A first light-reflecting member 230 is disposed in the demarcating groove 221. The first light-reflecting member 230 is made of, for example, a resin containing a light diffusing material. Examples of the resin used for the first light-reflecting member 230 include thermoplastic resins such as acrylic resin, polycarbonate resin, cyclic polyolefin resin, polyethylene terephthalate resin, or polyester resin, or thermosetting resins such as epoxy resin or silicone resin. Examples of materials used for the light diffusing material include known materials such as titanium oxide, silica, alumina, zinc oxide or glass. Alternatively, the first light-reflective member 230 may be made of a metal such as silver, aluminum, rhodium or platinum.

The first light-reflecting member 230 can be disposed in a layer covering at least the two lateral surfaces 221c and 221d and the lower surface 221e the demarcating groove 221. The first light-reflecting member 230 may also be disposed to fill the demarcating groove 221. The first light-reflecting member 230 also covers the protruding portions 223b on the upper surface portions 223 of the light guide member 220. Accordingly, a portion of the first light-reflecting member 230 is protruded above the flat portion 223a of the upper surface 223, which can facilitate the first light-reflecting member 230 to bring in contact with a lower surface of the wavelength converting member 240 to be described later below. The first light-reflecting member 230 can be disposed at other appropriate location. For example, all portions of the first light-reflecting member 230 may be disposed in the demarcating groove 221 and not cover the upper surface 223 of the light guide member 220, namely the flat portions 223a and the protruding portions 223b.

As shown in FIG. 2, each of the light source arrangement parts 222 extends through the light guide member 220 in the thickness direction (Z-direction), but each of the light source arrangement parts 220 may be a recess formed in the lower surface 224 of the light guide member 220.

A single light source 210 may be disposed in each of the light source arrangement parts 222. Alternatively, two or more light sources 210 may be disposed in each light source arrangement part 222. As shown in FIG. 1, each of the light source arrangement parts 222 has a circular shape in a top plan view, but shape of the light source arrangement parts 222, can be appropriately determined. For example, the light source arrangement parts 222 may have a polygonal shape such as such as a rectangular shape, a hexagonal shape or an octagonal shape in the top plan view.

As shown in FIG. 2, a second light-reflecting member 250 is disposed on the upper surface 110a of the wiring substrate 110 in each of the light source arrangement parts 222, between the light source 210 and the adhesive sheet 130. The second light-reflecting member 250 surrounds the light source 210 in a top plan view. The second light-reflecting member 250 is made of, for example, a resin containing a light diffusing material. Examples of the resin used for the second light-reflecting member 250 include thermoplastic resins or thermosetting resins as used for the first light-reflecting member 230. Examples of materials used for the light diffusing material include known materials such as titanium oxide, silica, alumina, zinc oxide or glass.

A light-transmissive member 260 is disposed in each of the light source arrangement parts 222. The light-transmissive member 260 is permeable to light emitted from the light sources 210. Examples of the material of the light-transmissive member 260 includes thermoplastic resins or thermosetting resins, similar to those used for the light guide member 220. In particular, in order to facilitate light emitted from the light sources 210 to enter the light guide member 220, the material of the light-transmissive member 260 is preferably the same as that of the light guide member 220 or a material whose refractive index for light emitted from light source 210 is lower than the refractive index of the light guide member 220. In addition, the light-transmissive member 260 may contain a light diffusing material such as titanium oxide, silica, alumina, zinc oxide or glass to a degree that does not block the light emitted from the light sources. Each light source arrangement part 222 is not necessarily provided with the light-transmissive member 260, and can be hollow.

The surfaces of each of the light-transmissive members 260 include an upper surface 261. The upper surface 261 of each of the light-transmissive members 260 is a flat surface and substantially flush with the upper surface 223 of the light guide member 220. Further, the upper surface 261 of each of the light-transmissive members 260 is covered by a light-adjusting member 270. The upper surface 261 of each of the light-transmissive members 260 may be recessed inward. When the upper surface 261 of each of the light-transmissive members 260 is recessed inward, the lower surface of the light adjusting members 270 is formed in a shape in conformity with the upper surface 261 of the light-transmissive member 260. With this arrangement, a portion of light emitted from each of the light source 210 can be reflected by the lower surface of a corresponding one of the light-adjusting members 270 in the X-direction, which can be easily made incident on the light guide member 220. Each of the light-adjusting members 270 is in contact with the entire upper surface 261 of a corresponding one of the light-transmissive members 260 and with a portion of the upper surface 223 of the light guide member 220, but may be in contact only with the entire upper surface 261 of the corresponding one of the light-transmissive members 260. Also, the light-adjusting member 270 may be in contact with a portion of the upper surface 261 of the light-transmissive member 260. For example, the light-adjusting member 270 may be disposed such that a peripheral portion of the upper surface 261 of the light-transmissive member 260 is exposed, or may be disposed in a dot shape in a top plan view. As such, each of the light-adjusting members 270 is located directly above the corresponding one of the light sources 210 and spaced apart from the light source 210.

Each of the light-adjusting members 270 is configured to reflect a portion of light emitted from the corresponding one of the plurality of the light sources 210 and to transmit a portion of light emitted from the corresponding one of the plurality of the light sources 210. Each of the light-adjusting members 270 can be made of, for example, a resin containing a light diffusing material. Examples of the resin used for the light-adjusting members 270 include silicone resin, epoxy resin, or resin which are mixture of those. Examples of materials used for the light diffusing material include known materials such as titanium oxide, silica, alumina, zinc oxide or glass. Dielectric multilayer film may be used for the plurality of light-adjusting members 270.

The light-adjusting member 270 can be disposed in the form of a layer. The light-adjusting member 270 can have a thickness substantially constant at each position in the X- and Y-directions. The thickness of the light-adjusting member 270 does not have to be constant at each position in the X- and Y-directions, for example, the light-adjusting member 270 may have a thickness less at the outer peripheral portion than a thickness of the portion located inward. With reducing the thickness of the outer peripheral portion of the light-adjusting member 270, luminance unevenness between the area above the light-adjusting member 270 and the area around it can be reduced. As shown in FIG. 1, the shape of the light-adjusting members 270 in the top plan view is similar to that of the light emission regions S and can be a rectangular shape. The shape of the light-adjusting members 270 can be appropriately determined. For example, the shape of the light-adjusting members 270 in the top plan view may be a polygonal shape such as a triangular shape, a hexagonal shape or an octagonal shape, or a circular shape.

Figure 4:
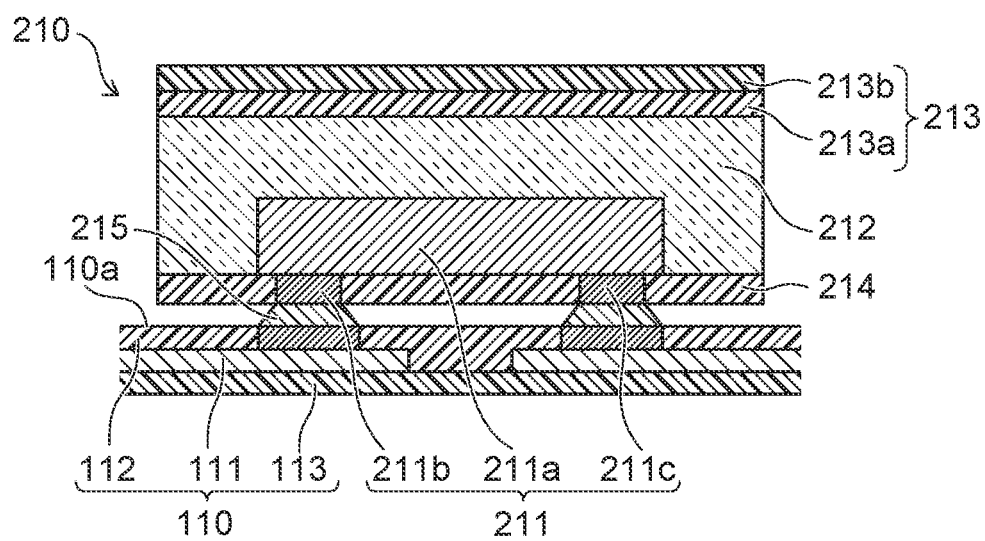
FIG. 4 is a cross-sectional view schematically showing an enlarged view of a portion of the light source and a portion of the wiring substrate shown in FIG. 2.

FIG. 4 is a partial cross-sectional view showing an enlarged view of the light source and a portion of the substrate shown in FIG. 2. Each of the light sources 210 is mounted on the upper surface 110a of the wiring substrate 110. Each of the light sources 210 includes, for example, a light emitting element 211, a light-transmissive layer 212, a light-shielding layer 213, and a covering layer 214.

Each of the light emitting elements 211 includes a semiconductor layered structure 211a in which a semiconductor layered body that includes a light emitting layer is formed on a light-transmissive substrate such as a sapphire, and positive and negative electrodes 211b and 211c respectively electrically connected to the semiconductor layered body. The semiconductor layered structure 211a can be configured to emit a blue light. The semiconductor layered structure 211a is preferably configured to emit light having a peak wavelength, for example in a range of 400 to 530 nm, more preferably in a range of 420 to 490 nm, further preferably in a range of 450 to 475 nm. For the semiconductor layered body containing a light emitting layer, $In_xAl_yGa_{1-x-y}N$ ($0 \leq x$, $0 \leq y$, $x+y \leq 1$) can be used. In addition, the semiconductor layered structure 211a does not have to have a light-transmissive substrate, so the light-transmissive substrate can be removed from the semiconductor layered body as appropriate. Each of the electrodes 211b and 211c is bonded to the wiring substrate 110 by an electrically conductive bonding member 215.

The light-transmissive layer 212 covers the upper surface and lateral surfaces of the semiconductor layered structure 211a. The light-transmissive layer 212 is permeable to light emitted from the semiconductor layered structure 211a. Examples of the materials of the light-transmissive layer 212 include epoxy resin, silicone resin, resins which are mixtures of those. The light-transmissive layer 212 may contain a light diffusing material to a degree not to shield light from the light emitting element 211. For example, the light diffusing material may be contained in the light-transmissive layer 212 such that the light-transmissive layer 212 exhibits a transmittance in a range of about 50 to 99%, preferably in a range of about 70 to 90% to light from the light emitting element 211. Examples of materials used for the light diffusing material include titanium oxide, silica, alumina, zinc oxide or glass.

The light-shielding layer 213 covers an upper surface of the light-transmissive layer 212. The light-shielding layer 213 exhibits a transmittance to light from the light emitting element 211 in a range of 1 to 50%, preferably in a range of 3 to 30%, which allows avoiding the portion directly above the light source 210 exhibiting excessive brightness. For example, the light-shielding layer 213 includes a first layer 213a abutting the upper surface of the light-transmissive layer 212 and a second layer 213b disposed on the first layer 213a. Each of the first and second layers 213a and 213b can be made of, for example, a resin containing a light diffusing material. More specifically, each of the first and second layers 213a and 213b can be made of, for example, silicone resin or epoxy resin containing a light diffusing material such as titanium oxide, silica, alumina, zinc oxide or glass. The light-shielding layer 213 may include a single layer or three or more layers, instead of two layers.

The covering layer 214 covers the lower surface of the light-transmissive layer 212 and the lower surface of the semiconductor layered structure 211a. The covering layer 214 can be made of, for example, a resin containing a light diffusing material. More specifically, the covering layer 214 can be made of silicone resin or epoxy resin containing a light diffusing material, for example, titanium oxide, silica, alumina, zinc oxide or glass.

As shown in FIG. 2, the wavelength converting member 240 covers the upper surface 223 of the light guide member 220.

The wavelength converting member 240 is in contact with the first light-reflecting member 230 and the light-adjusting member 270.

The wavelength converting member 240 is configured to convert the wavelength of a portion of light emitted from the light sources 210.

The wavelength converting member 240 includes, for example, a base made of a light-transmissive material and a fluorescent material dispersed in the base. Examples of the materials of the light-transmissive layer 212 include epoxy resin, silicone resin, resins which are mixtures of those, or glass. For example, the color of light whose wavelength being converted by the fluorescent material is yellow. Examples of yellow fluorescent material configured to emit yellow light include: $Y_3Al_5O_{12}$:Ce or $(Y,Lu,Gd)_3(Al, Ga)_5O_{12}$:Ce fluorescent materials. The light-emitting module 200 is configured to emit a white light that can be obtained by mixing the yellow light wavelength converted by the fluorescent material and the blue light emitted from the light source 210.

The color of light whose wavelength converted by the fluorescent material other than yellow light may be employed. For example, the wavelength converting member 240 may contain a red fluorescent material configured to emit a red wavelength converted light and a green fluorescent material configured to emit a green wavelength converted light. Thus, the light emitting module 200 can emit white light that is a mixture of red light and green light respectively wavelength converted by the fluorescent materials, and a blue light emitted from the light source 210. For the red fluorescent material configured to emit red light, a nitride-based fluorescent material having the composition represented by $CaAlSiN_3$:Eu or $(Sr, Ca)AlSiN_3$:Eu, or a fluoride-based fluorescent material such as a KSF-based fluorescent material or a MGF-based fluorescent material can be used. For the green fluorescent material configured to emit green light, a β-sialon-based fluorescent material or a LuAG fluorescent material can be used.

All or a portion of the fluorescent material contained in the wavelength converting member 240 can be substituted by quantum dots (QD). Quantum dots are semiconductor particles with a diameter in a range of several nanometers to several tens of nanometers. Similar to that of the fluorescent materials, quantum dots can absorb light emitted from the light sources 210 for example, and can emit light having a color that is different from the color of the absorbed light.

The wavelength converting member 240 is, for example, a sheet-shaped member. However, the wavelength converting member 240 does not have to be a sheet-shaped member. For example, the wavelength converting member 240 may be a layer applied on the light guide member 220 by using spraying etc.

For example, an air layer K may be included between the wavelength converting member 240 and the upper surface 223 of the light guide member 220. The air layer K may be provided by disposing the wavelength converting member 240 on the first light-reflecting member 230 and the light-adjusting member 270 thereby spacing the wavelength converting member 240 apart from the light guide member 220, or by disposing at least one spacer member between the wavelength converting member 240 and the light guide member 220. Alternatively, there may be no need to include an air layer K between the wavelength converting member 240 and the light guide member 220. In other words, the wavelength converting member 240 and the light guide member 220 may be in contact with each other.

Figure 5:
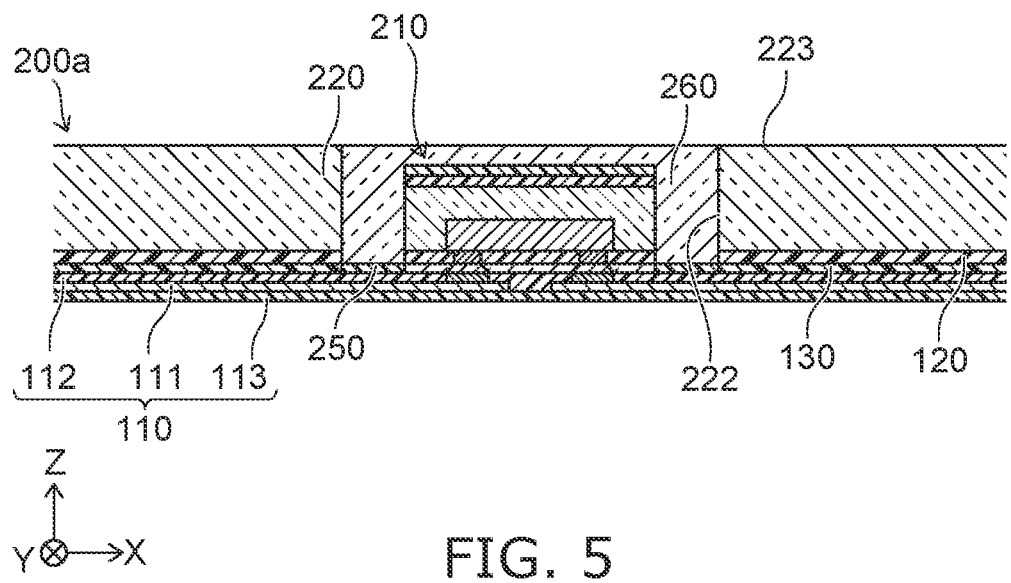
FIG. 5 is a schematic diagram illustrating an exemplary method of manufacturing a surface light source having a light emitting module according to an embodiment of the present disclosure.

Next, one example of a method of manufacturing a light emitting module 200 according to the present embodiment will be described. FIG. 5 to FIG. 8 are schematic diagrams illustrating one example of a method of manufacturing a surface light source having a light emitting module according to the present embodiment. As shown in FIG. 5, an intermediate body 200a is provided. The intermediate body 200a has a light guide member 220 with a plurality of light source arrangement parts 222 and a plurality of light sources 210 respectively disposed in the plurality of light source arrangement parts 222. The intermediate body 200a further includes a second light-reflecting member 250 and a light-transmissive member 260. The intermediate body 200a is disposed on a base that including a wiring substrate 110, a light-reflecting sheet 120, and an adhesive sheet 130.

Figure 6:
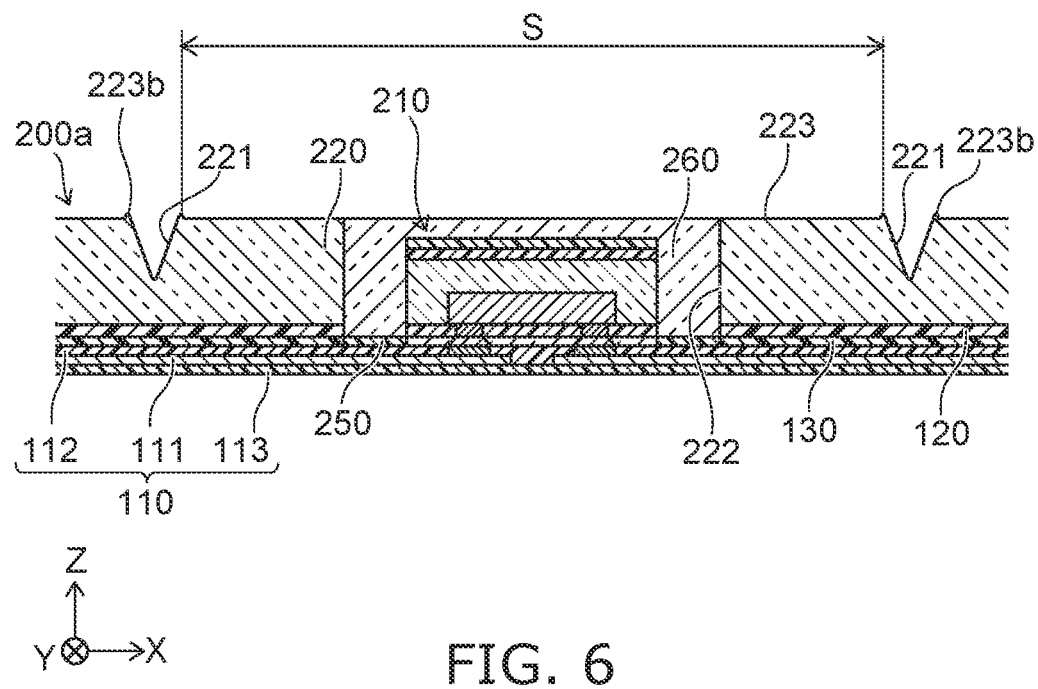
FIG. 6 is a schematic diagram illustrating an exemplary method of manufacturing a surface light source having a light emitting module according to an embodiment of the present disclosure.

Next, as shown in FIG. 6, the demarcating groove 221 configured to demarcate light-emitting regions S each being provided with the light source arrangement part 222 is formed in the upper surface 223 of the light guide member 220. More specifically, the demarcating groove 221 is formed between two adjacent light source arrangement parts 222. Thus, the demarcating groove 221 is formed after the light source 210 is disposed in each of the light source arrangement parts 222. In this way, the location to form the demarcating groove 221 can be adjusted corresponding to the locations of the light sources 210. The demarcating groove 221 can be formed, for example, using a cutting device such as a cutting die. When the cutting device cuts the light guide member 220, a portion of the light guide member 220 may be pushed aside to form protruding portions 223b along the demarcating groove 221. The demarcating groove 221 may be formed using a laser processing device etc., in addition to such a cutting device.

Figure 7:
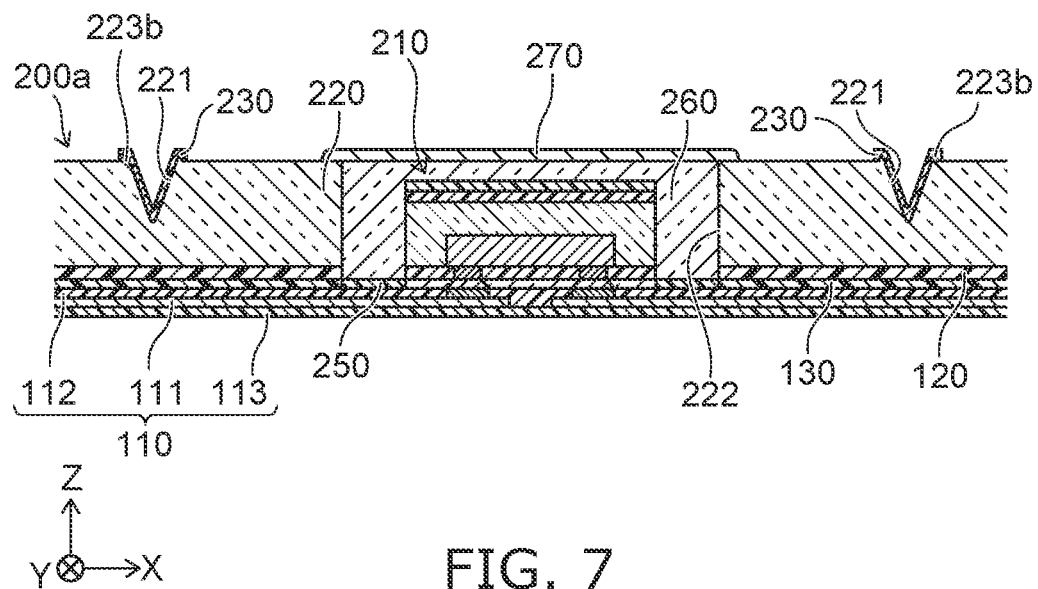
FIG. 7 is a schematic diagram illustrating an exemplary method of manufacturing a surface light source having a light emitting module according to an embodiment of the present disclosure.

Next, as shown in FIG. 7, a first light-reflecting member 230 is disposed on portions of the upper surface of the light guide member 220 at locations in and around the demarcating groove 221. At the same time, a light-adjusting member 270 may be disposed on the light-transmissive member 260. The timing of disposing the light-adjusting members 270 can be appropriately determined. For example, the light-adjusting member 270 may be disposed before the demarcating groove 221 is formed. Alternatively, the light-adjusting member 270 may be disposed after forming the demarcating groove 221 and before disposing the first light-reflecting member 230. The light-adjusting member 270 may be disposed after the first light-reflecting member 230 has been disposed.

Figure 8:
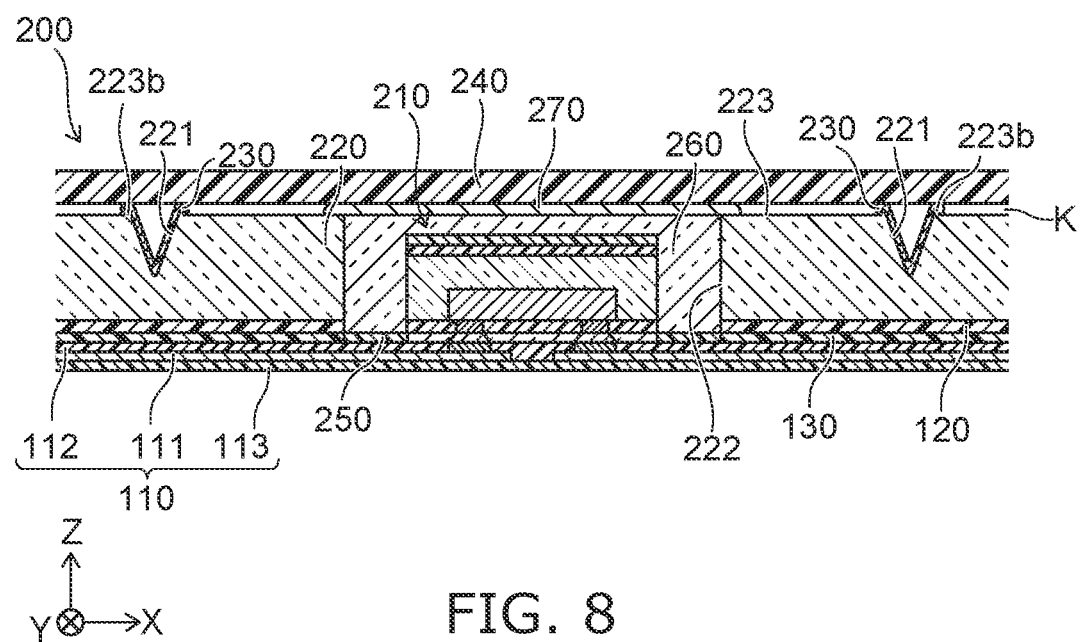
FIG. 8 is a schematic diagram illustrating an exemplary method of manufacturing a surface light source having a light emitting module according to an embodiment of the present disclosure.

Then, as shown in FIG. 8, a wavelength converting member 240 is disposed on the light-adjusting member 270 and on the first light-reflecting member 230 to cover the upper surface 223 of the light guide member 220. With this, a light emitting module 200 can be fabricated.

When the light source arrangement parts are recesses formed in the lower surface of the light guide member, the intermediate body does not have to be disposed on the base body that includes the wiring substrate, the light-reflecting sheet, and the adhesive sheet during the step of providing intermediate body. In such cases, each of the light sources is disposed on a corresponding one of the light source arrangement parts, which is the recess defined in the provided intermediate body, and the light sources can be fixed to the light guide member by filling the light source arrangement parts with a light-transmissive member. Then, the demarcating groove is formed in the light guide member of the provided intermediate body, and the first light-reflecting member and the second light-reflecting member are disposed in the demarcating groove to obtain the light emitting module. The light emitting module may be disposed on the base body that includes a wiring substrate, a light-reflecting sheet, and an adhesive sheet to form a surface light source.

Figure 9:
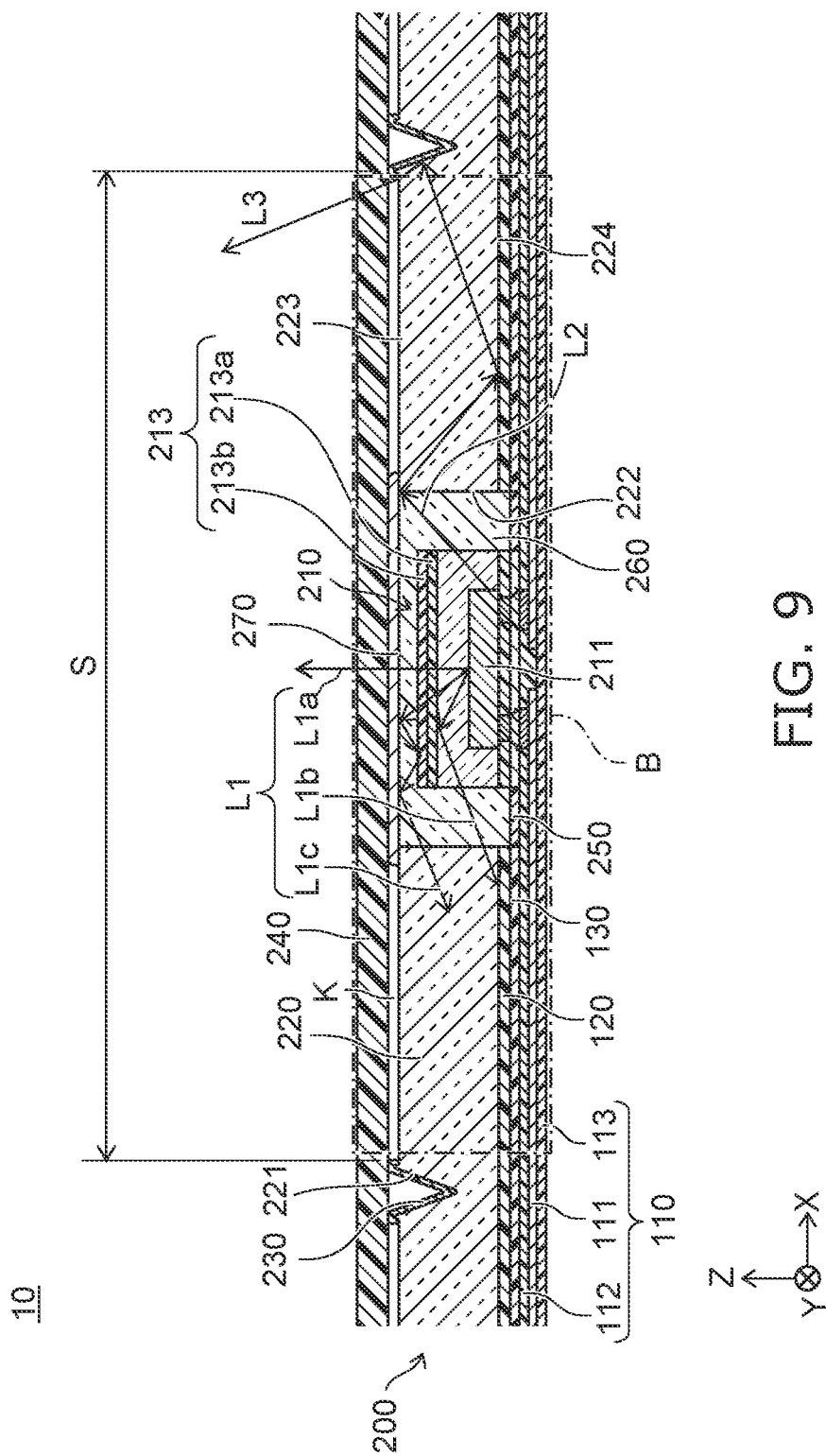
FIG. 9 is a schematic cross-sectional view taken along line 2-2 of FIG. 1, illustrating paths of light emitted from a light source.

Next, operation of the light emitting module 200 according to the present embodiment will be described below. FIG. 9 is a schematic cross-sectional view taken along line 2-2 of FIG. 1, illustrating paths of light emitted from a light source. In the below, a portion of a surface light source 10, located directly above and directly below a single light-emitting region S, will be referred to as a "segment B". In other words, the "segment B" is referred to as a portion of the surface light source 10 located in the light-emitting region S in a top plan view.

In a single segment B, a first portion L1a of the light L1 emitted from the upper surface of the light emitting element 211 is, for example, transmitted through the light-shielding layer 213 and the light-adjusting member 270, and enters the wavelength converting member 240. Meanwhile, a second portion L1b of the light L1 is, for example, reflected by the light-shielding layer 213, and propagates toward the lower surface 224 of the light guide member 220 or toward the second light-reflecting member 250. Also, a third portion L1c of the light L1 is, for example, transmitted through the light-shielding layer 213 and is reflected at the light-adjusting member 270 and the light-shielding layer 213, and as a whole propagates in a direction such as the X- and Y-directions that crosses the Z-direction.

As described above, the light-shielding layer 213 and the light-adjusting member 270 reflect a portion of light L1. With the configuration described above, in the irradiation area in a single segment B, the luminance of the region located directly above the light source 210 can be maintained so as not to be excessively higher than the luminance of other regions. In the description below, a portion of the irradiation area in a single segment B at a location directly above the light source 210 may be simply referred to as the "area directly above the light source".

Further, this also increases the luminance of light emitted from the light source 210 in the irradiation area directly above the light source in the irradiation area in a single segment B, and thus can reduce or substantially prevent occurrence of color mis-balancing between the light emitted from the light source 210 and the wavelength converted light.

Furthermore, at the light-shielding layer 213 and the light-adjusting member 270, other portion of the light L1 can be, as a whole, directed in a direction perpendicular to the Z-direction. This allows light to be propagated to the area near the demarcating groove 221 in the light guide member 220.

Also, a portion of the second portion L1b of light, a portion of the third portion L1c of light, and a portion of light L2 emitted from the lateral surfaces of the light emitting element 211 are, for example, reflected at one or more members among the second light-reflecting member 250, the light-adjusting member 270, and the light-reflecting sheet 120, and as a whole propagates in a direction crossing the Z-direction, and then is reflected at the first light-reflecting member 230. This allows light to be propagated to the area near the demarcating groove 221 in the light guide member 220, while reducing or substantially preventing light emitted from the light source 210 of a single segment B from entering adjacent segments B. As a result, most portion of the light emitted from the light source 210 of a single segment B can be emitted from the light-emitting region S of the same segment B of the upper surface 223 of the light guide member 220.

The wavelength converting member 240 is in contact with portions of the first light-reflecting member 230. As a result, most of the light emitted from the light-emitting region S of a single segment B enters the area directly above the light-emitting region S of the wavelength conversion component 240. This can further reduce or substantially prevent light emitted from the light-emitting region S of a single segment B from entering one or more adjacent segments B. Accordingly, portions of the wavelength-converting member 240 located directly above the respective light-emitting regions S can be caused to emit mainly the wavelength-converted light.

In the present embodiment, for example as shown in FIG. 9, light L2 emitted from a lateral surface of the light emitting element 211 and propagating in a direction intersecting the Z-direction as a whole is reflected by the first light-reflecting member 230 and emitted from the upper surface 223 of the light guide member 220, as indicated by the arrow L3. Thus, the first light-reflecting member 230 reflects a portion of the light emitted from the light source 210, such that the length of optical path of the light propagating in the wavelength converting member 240 can be prevented from becoming too large. As a result, it is possible to reduce or prevent the imbalance between the light emitted from the light source 210 and the wavelength-converted light that results in uneven color.

Further, an air layer K is included between the wavelength converting member 240 and the upper surface 223 of the light guide member 220. The presence of the air layer K can improve the extraction efficiency of the light of the light emitting module 200.

Further, the wavelength converting member 240 and the light-adjusting member 270 are in contact with each other. This arrangement can reduce or prevent light emitted from the area of the upper surface 223 of the light guide member 220 between the light-adjusting member 270 and the demarcating groove 221 from entering the area directly above the light-adjusting member 270 of the wavelength converting member 240. Accordingly, luminance in a region directly above the light source can be prevented from becoming higher than other area in the illumination area of the segment B. This also can reduce or prevent generation of uneven color caused by imbalance of color between the light emitted from the light source 210 and the wavelength converted light that occurs when the luminance of the light emitted from the light source 210 in a region directly above the light source 210 becomes higher than other area in the illumination region of the segment B.

A surface light source 10 having the light emitting module 200 can be used, for example, for the backlight of a liquid crystal display. In a backlight using the surface light source 10, local dimming for individually controlling luminance of each segment B can be performed with high accuracy by adjusting the output of each light source 210 independently.

Next, effects of the embodiments will be described. The light emitting module 200 according to the present embodiment includes at least one light source 210, a light guide member 220, a first light-reflecting member 230, and a wavelength converting member 240. The light guide member 220 includes demarcating groove 221 configured to demarcate at least one light emitting region S, and at least one light source arrangement part 222 located within each of the at least one light emitting region S and accommodating a corresponding one of the at least one light source 210. The first light-reflecting member 230 is disposed in the demarcating groove 221. The wavelength converting member 240 covers the upper surface 223 of the light guide member 220. With this arrangement, the light emitting module 200 that allows individual controlling of light emitted from each of the light-emitting regions S can be realized.

Further, the demarcating groove 221 is formed between the adjacent light source arrangement parts 222. This reduces or prevents light emitted from the light source 210 in the light source arrangement part 222 in a single segment B from entering one or more adjacent segments B.

Moreover, an air layer K is included between the upper surface 223 of the light guide member 220 and the wavelength converting member 240. Accordingly, the light extraction efficiency of the light emitting module 200 can be improved.

The demarcating groove 221 is a recess provided in the upper surface 223 of the light guide member 220. Thus, the light guide material 220 is not completely separated by the demarcating groove 221. Accordingly, the mechanical strength of the light emitting module 200 can be improved.

The first light-reflecting member 230 is in contact with the wavelength converting member 240. This arrangement can reduce or prevent the light emitted from the upper surface 223 of the light guide member 220 of a single segment B from entering the one or more adjacent segments B. As a result, the light emitted from each of the light-emitting regions S can be individually controlled.

Further, the light emitting module 200 includes at least one light adjusting member 270 that contains a light diffusing material and is located directly above a corresponding one of the at least one first light source 210 and spaced apart from the corresponding one of the at least one first light source 210, and is configured to reflect a portion of light emitted from the corresponding one of the at least one first light source 210 and to transmit another portion of light emitted from the corresponding one of the at least one first light source 210. Therefore, it is possible to reduce or prevent the brightness of the region directly above the light source in each segment B from being higher than that of the other regions. In addition, in the region directly above the light source 210 of each of the segments B, it is possible to reduce or prevent color-unevenness caused by imbalance in mixing colors of light between the light emitted from the light source 210 and the wavelength-converted light.

The wavelength converting member 240 is in contact with the light-adjusting member 270. This can reduce or prevent the luminance of the region directly above the light source in each of the at least one segment B from becoming higher than that of the other regions. In addition, in the region directly above the light source 210 of each of the segments B, it is possible to reduce or prevent color-unevenness caused by imbalance in mixing colors of light between the light emitted from the light source 210 and the wavelength-converted light.

The at least one light source 210 includes a light emitting element 211 and a light-shielding layer 213 located directly above the light emitting element 211. This can reduce or prevent the luminance of the region directly above the light source in each of the at least one segment B from becoming higher than that of the other regions.

In addition, the light emitting module 200 includes a light-transmissive member 260 disposed to fill the light source arrangement part 222. This arrangement can reduce or prevent the light emitted from the light source 210 from being reflected at the lateral surfaces of the light source arrangement part 222.

In an exemplary method of manufacturing the light emitting module 200 according to the present embodiment, as shown in FIG. 5, an intermediate body 200a is provided. The intermediate body 200a includes a light guide member 220 provided with at least one light source arrangement part 222 and a light source 210 disposed in each of the at least one light source arrangement part 222. Next, as shown in FIG. 6, the demarcating groove 221 configured to demarcate the at least one light-emitting region S each being provided with the light source arrangement part 222 is formed in the upper surface 223 of the light guide member 220. Next, as shown in FIG. 7, a first light-reflecting member 230 is disposed in the demarcating groove 221. Then, as shown in FIG. 8, a wavelength converting member 240 is disposed to cover the upper surface 223 of the light guide member 220. In this way, after the at least one light source 210 is disposed in the light source arrangement part 222, the demarcating groove 221 is formed. Accordingly, the location to form the demarcating groove 221 can be adjusted corresponding to the location of each of the at least one light source 210. This arrangement allows for realizing a light emitting module 200 in which light emitted from the at least one light-emitting region S can be controlled.

Variational Example 1

Figure 10:
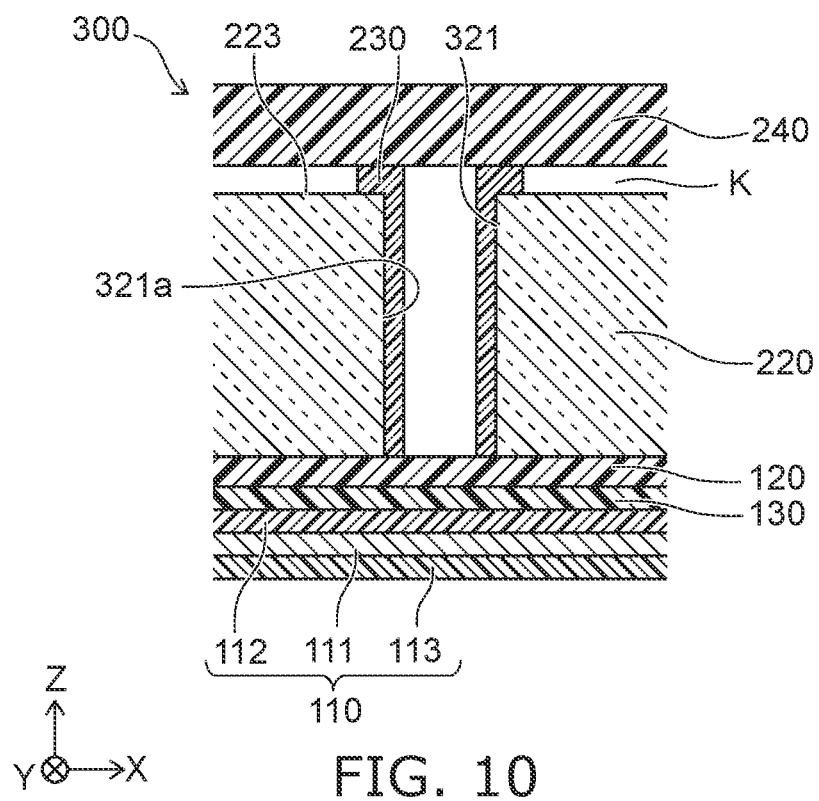
FIG. 10 is a partially enlarged cross-sectional view of the demarcating groove and a portion around the demarcating groove, of a surface light source having a light emitting module according to a variational example 1, corresponding to the portion shown in FIG. 3.

Next, a variational example 1 of the embodiment will be described. FIG. 10 is a partially enlarged cross-sectional view of the demarcating groove and a portion around the demarcating groove, of a surface light source having a light emitting module according to the variational example 1, corresponding to the portion shown in FIG. 3. The light emitting module 300 in the variational example 1 differs from the light emitting module 200 in the shape of the demarcating groove 321. In the description below, the differences from that have been illustrated in the embodiment described above will be mainly described. The variational example 1 is similar to those in the embodiment described above except for those described below.

The demarcating groove 321 is a through-hole that penetrates the light guide member 220 in the Z-direction (thickness direction) of the light guide member. This arrangement allows a further reduction of light emitted from the light source 210 of a single segment B from entering (one or more) adjacent segments B. As a result, the light emitted from each of the at least one light-emitting regions S can be controlled. A layer of a first light-reflecting member 230 is disposed on the inner lateral surfaces of the light guide member 220 defining the demarcating groove 321, but the first light-reflecting member 230 may be disposed extended to also cover the upper surface of the light-reflecting sheet 120 exposed in the through hole. The first light-reflecting member 230 may also be disposed to fill a portion or the entirety of the demarcating groove 321.

FIG. 10 shows an example in which the lateral surfaces 321a defining the demarcating groove 321 are flat surfaces substantially in parallel to the Z-direction. But the lateral surfaces 321a defining the demarcating groove 321 do not have to be parallel to the Z-direction or do not have to be flat surfaces.

Variational Example 2

Figure 11:
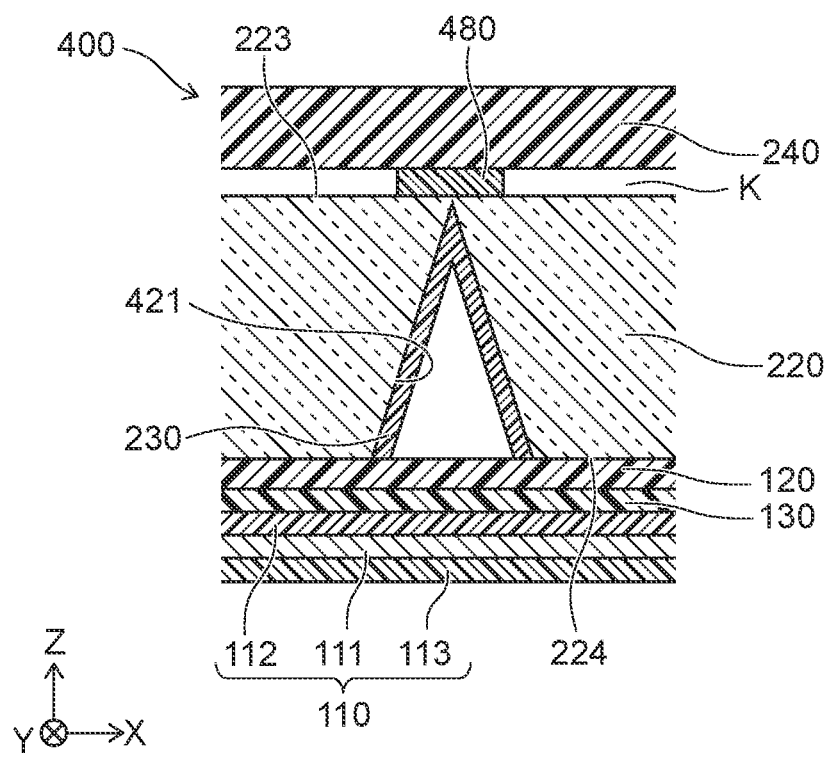
FIG. 11 is a partially enlarged cross-sectional view of the demarcating groove and a portion around the demarcating groove, of a surface light source having a light emitting module according to a variational example 2, corresponding to the portion shown in FIG. 3.

Next, a variational example 2 of the embodiment will be described. FIG. 11 is a partially enlarged cross-sectional view of the demarcating groove and a portion around the demarcating groove, of a surface light source having a light emitting module according to the variational example 1, corresponding to the portion shown in FIG. 3. The light emitting module 400 in the variational example 1 differs from the light emitting module 200 in the shape of the demarcating groove 421.

The demarcating groove 421 is a recess provided in the lower surface 224 of the light guide member 220. With the demarcating groove 421, light emitted from the light source 210 of a single segment B entering adjacent at least one segment B can be reduced or prevented. Thus, the light emitted from each of the at least one light-emitting region S can be controlled. A layer of a first light-reflecting member 230 is disposed on the surfaces defining the demarcating groove 421, but the first light-reflecting member 230 can be disposed to partially or entirely fill the demarcating groove 421.

Moreover, at least one spacer member 480 is disposed between the light guide member 220 and the wavelength converting member 240 to create an air layer K. The air layer K provided by the at least one spacer member 480 can improve the light extraction efficiency of the light emitting module 400.

The at least one spacer member 480 is disposed, for example, directly above the demarcating groove 421. For example, the at least one spacer member 480 contains a light diffusing material to reflect a portion of light emitted from the light source 210. With this arrangement, light emitted from the upper surface 223 of the light guide member 220 of a single segment B can be prevented or diverted from entering the at least one adjacent segment B. Alternatively, it is possible that the at least one spacer member 480 is not provided between the light guide member 220 and the wavelength converting member 240, and the wavelength converting member 240 may be in contact with the upper surface 223 of the light guide member 220.

Variational Example 3

Figure 12:
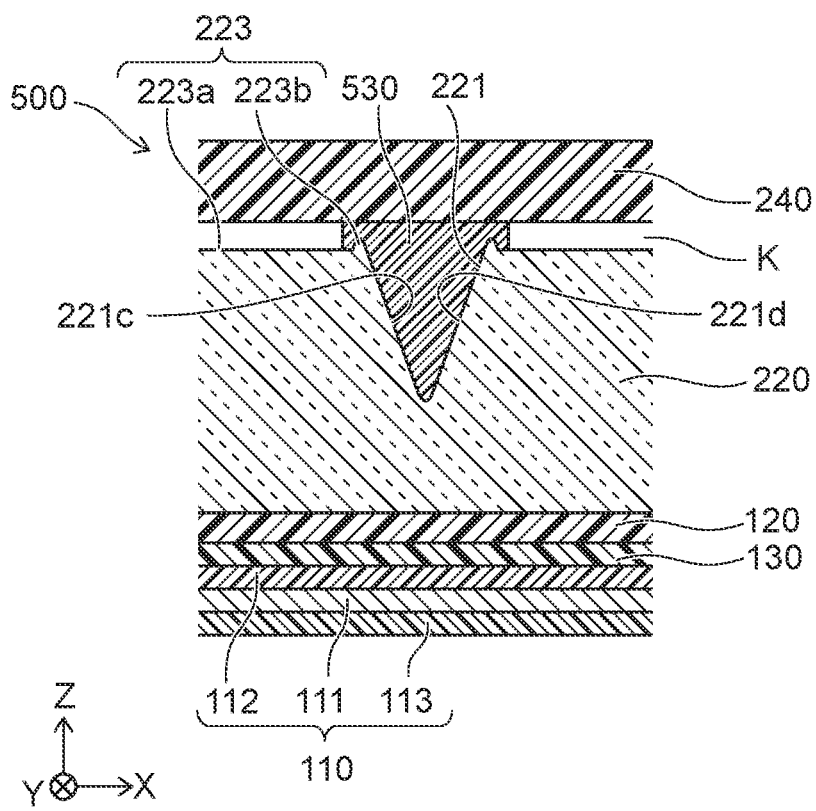
FIG. 12 is a partially enlarged cross-sectional view of the demarcating groove and a portion around the demarcating groove, of a surface light source having a light emitting module according to a variational example 3, corresponding to the portion shown in FIG. 3.

Next, a variational example 3 of the embodiment will be described. FIG. 12 is a partially enlarged cross-sectional view of the demarcating groove and a portion around the demarcating groove, of a surface light source having a light emitting module according to the variational example 3, corresponding to the portion shown in FIG. 3. The light emitting module 500 of the variational example 3 differs from the light emitting module 200 in the shape of the first light-reflecting member 530 disposed in the demarcating groove 530.

The first light-reflecting member 530 is disposed in the demarcating groove 221 to fill the entire of the demarcating groove 221. With this arrangement, light emitted from the light source 210 of a single segment B can be further prevented or diverted from entering the at least one adjacent segment B, compared to that in the light emitting module 200 according to the embodiment described above.

In FIG. 12, the upper surface of the first light-reflecting member 530 is a flat surface. But the top surface of the first light reflectance member 530 does not need to be a flat surface, for example the center portion may be recessed, for example, in a concave shape or may be protruded, for example, in a convex shape.

Variational Example 4

Figure 13:
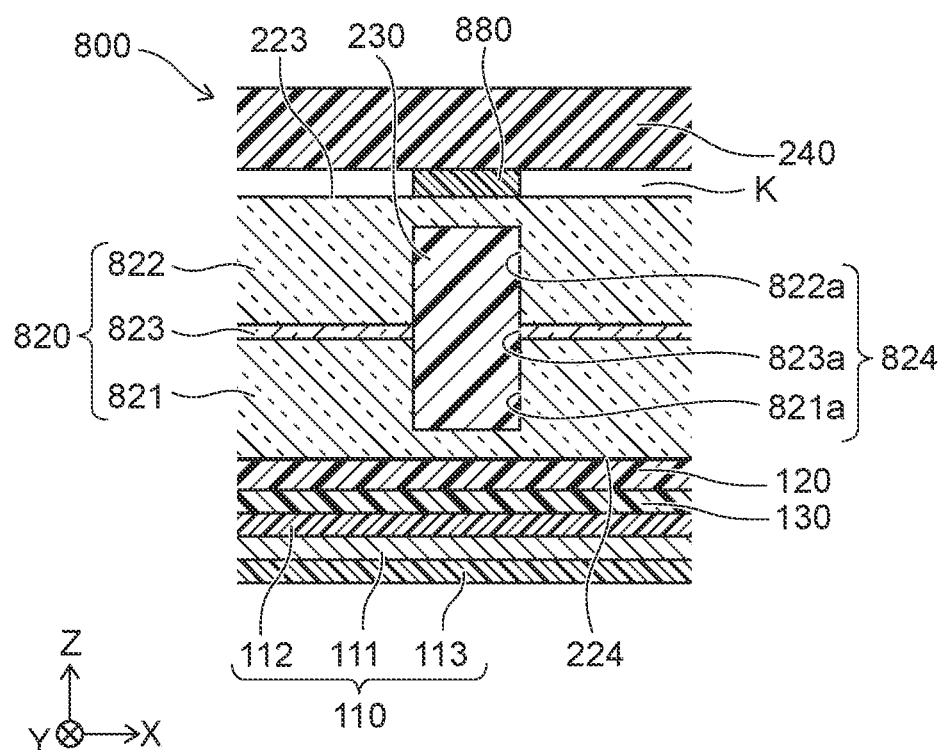
FIG. 13 is a partially enlarged cross-sectional view of the demarcating groove and a portion around the demarcating groove, of a surface light source having a light emitting module according to a variational example 4, corresponding to the portion shown in FIG. 3.

Next, a variational example 4 of the embodiment will be described. FIG. 13 is a partially enlarged cross-sectional view of the demarcating groove and a portion around the demarcating groove, of a surface light source having a light emitting module according to the variatiodal example 4, corresponding to the portion shown in FIG. 3. The light emitting module 800 in the variational example 4 differs from the light emitting module 200 in the configuration of the demarcating groove 820.

The light guide member 820 has a first light guide layer 821, a second light guide layer 822, and an adhesive sheet 823. The first light guide layer 821 is in contact with the upper surface of the light-reflecting sheet 120. The second light guide layer 822 is located above the first light guide layer 821. The adhesive sheet 823 is located between the first light-guide layer 821 and the second light-guide layer 822 and is adhered to the first light-guide layer 821 and the second light-guide layer 822. The light guide member 820 may include three or more layers.

The first light guide layer 821, the second light guide layer 822, and the adhesive sheet 823 are permeable to light emitted from the light sources 210. It is preferable that the materials of the first light guide layer 821, the second light guide layer 822, and the adhesive sheet 823 are the same to reduce or prevent generation of interfaces between the members. But the materials of the first light-guide layer 821, the second light-guide layer 822, and the adhesive sheet 823 may be differ from each other. Examples of the materials of the first light-guide layer 821, the second light-guide layer 822, and the adhesive sheet 823 include thermoplastic resins such as acrylic resin, polycarbonate resin, cyclic polyolefin resin, polyethylene terephthalate resin, and polyester resin, or thermosetting resins such as epoxy resin or silicone, or glass.

The light guide member 820 of the light guide member 220 is formed with a demarcating groove 824 to demarcate at least one light-emitting region S in a top plan view. The demarcating groove 824 is formed inside the light guide member 820. More specifically, the demarcating groove 824 includes a recess 821a formed in the upper surface of the first light guide layer 821, a through hole 823a formed through the adhesive sheet 823, and a recess 822a formed in the lower surface of the second light guide layer 822.

The recesses 821a, 822a and the through-hole 823a are aligned in a superimposed manner in a top plan view. The demarcating groove 824 can be defined in a rectangular shape in cross section. But the cross-sectional shape of the demarcating groove 824 may be a trapezoidal shape. Further, the demarcating groove 824 may also pass through the first light guide layer 821, the second light guide layer 822, and the adhesive sheet 823 in the Z-direction.

A first light-reflecting member 230 is disposed in the demarcating groove 824. As shown in FIG. 13, the first light-reflecting member 230 is disposed in the demarcating groove 824 and fills the entire of the demarcating groove 824. But the first light-reflecting member 230 may be partially filled in the demarcating groove 824, or may be disposed in a layer to cover at least a portion of the surfaces of the demarcating groove 824.

Moreover, at least one spacer member 880 configured to provide an air layer K is included between the light guide member 820 and the wavelength converting member 240. The air layer K provided by the at least one spacer member 880 can improve the light extraction efficiency of the light emitting module 800.

For example, the at least one spacer member 880 contains a light diffusing material to reflect a portion of light emitted from the light source 210. With this arrangement, light emitted from the upper surface 223 of the light guide member 820 of a single segment B can be prevented or diverted from entering the at least one adjacent segment B. Meanwhile it is possible that the at least one spacer member 880 is not provided between the light guide member 220 and the wavelength converting member 240, and the wavelength converting member 240 may be in contact with the upper surface 223 of the light guide member 220.

As described above, the light guide member 820 may have a multilayer structure, and the demarcating groove 824 may be formed in the light guide member 820.

Variational Example 5

Figure 14:
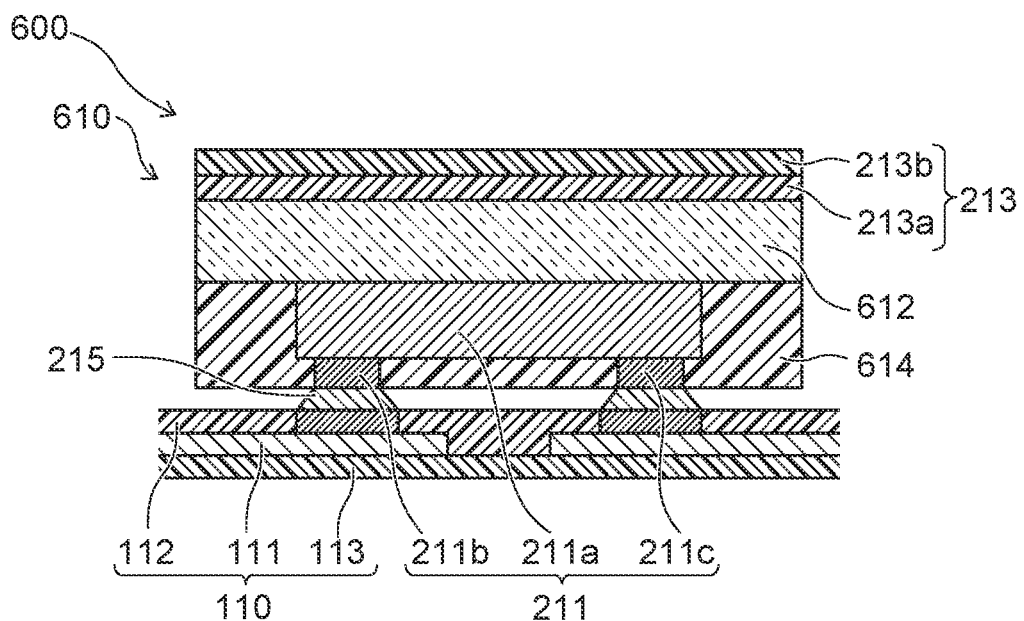
FIG. 14 is a partially enlarged cross-sectional view of the light source and a portion around the demarcating groove, of a surface light source having a light emitting module according to a variational example 5, corresponding to the portion shown in FIG. 4.

Next, a variational example 5 of the embodiment will be described. FIG. 14 is a partially enlarged cross-sectional view of a light source and a portion of a wiring substrate of a surface light source having a light emitting module according to the variational example 4, corresponding to the portion shown in FIG. 4. The light emitting module 600 in the variational example 4 differs from the light emitting module 200 in the configuration of the demarcating groove 610.

At least one light source 610 includes a light emitting element 211, a light-transmissive layer 612, a light-shielding layer 213, and a covering layer 614. The light-transmissive layer 612 covers an upper surface of the light emitting element 211. The covering layer 614 covers lateral surfaces and a lower surface of the light emitting element 211. In such a light source 610, providing a light-shielding layer 213 allows for reducing or preventing a luminance in a region directly above the light source 610 from becoming higher than other area.

Variational Example 6

Figure 15:
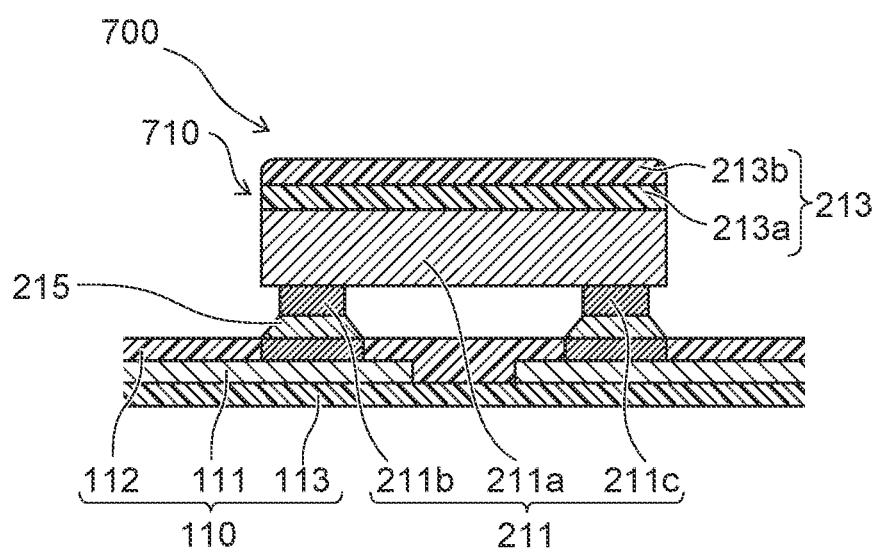
FIG. 15 is a partially enlarged cross-sectional view of the light source and a portion around the demarcating groove, of a surface light source having a light emitting module according to a variational example 6, corresponding to the portion shown in FIG. 4.

Next, a variational example 6 of the embodiment will be described. FIG. 15 is a partially enlarged cross-sectional view of a light source and a portion of a wiring substrate of a surface light source having a light emitting module according to the variational example 4, corresponding to the portion shown in FIG. 4. The light emitting module 700 according to the variational example 4 differs from the light emitting module 200 according to the embodiment described above in the configuration of the light source 710.

The light source 710 includes, a light emitting element 211 and a light-shielding layer 213. The light-shielding layer 213 is in contact with an upper surface of the light emitting element 211. The light source 710 is not provided with a light-transmissive layer 212 and a covering layer 214. As described above, it is possible to reduce or prevent the brightness of the region directly above the light source in the irradiation area of a single segment B from being higher than that of the other regions.

A light emitting module according to the present disclosure can be used for surface light sources such as backlight, for example.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting module comprising:
   at least one first light source;
   a light guide member comprising
      a demarcating groove configured to demarcate at least one first light emitting region, and
      at least one first light source arrangement part provided in the at least one first light emitting region and accommodating a corresponding one of the at least one first light source;
   a wavelength converting member covering an upper surface of the light guide member; and
   at least one light adjusting member located in a region directly above a corresponding one of the at least one first light source,
   wherein the at least one light adjusting member is configured to reflect a portion of light emitted from the corresponding one of the at least one first light source and to transmit another portion of the light emitted from the corresponding one of the at least one first light source, and
   wherein the wavelength converting member is located on or above an upper surface of the at least one light adjusting member.

2. The light emitting module according to claim 1, wherein the demarcating groove surrounds the at least one first light source arrangement part.

3. The light emitting module according to claim 1, further comprising at least one second light source, wherein
   the light guide member further comprises at least one second light source arrangement part located in at least one second light emitting region adjacent to the at least one first light emitting region in a top plan view and accommodating a corresponding one of the at least one second light source, and
   the demarcating groove is located between the at least one first light source arrangement part and the at least one second light source arrangement part.

4. The light emitting module according to claim 1, wherein an air layer is included between the upper surface of the light guide member and the wavelength converting member.

5. The light emitting module according to claim 1, wherein the demarcating groove opens at least to the upper surface of the light guide member.

6. The light emitting module according to claim 5, wherein the demarcating groove is a recess formed in the upper surface of the light guide member.

7. The light emitting module according to claim 5, wherein the demarcating groove penetrates the light guide member in a thickness direction of the light guide member.

8. The light emitting module according to claim 5, wherein the upper surface of the light guide member includes protruding portions along the demarcating groove.

9. The light emitting module according to claim 5, further comprising a light-reflecting member disposed in the demarcating groove.

10. The light emitting module according to claim 9, wherein the light-reflecting member is in contact with the wavelength converting member.

11. The light emitting module according to claim 1, wherein the demarcating groove is a recess formed in a lower surface of the light guide member.

12. The light emitting module according to claim 1, wherein the wavelength converting member is in contact with the at least one light adjusting member.

13. The light emitting module according to claim 1, wherein the at least one first light source comprises a light emitting element, and a light-shielding layer located directly above the light emitting element.

14. The light emitting module according to claim 13, wherein the at least one first light source further comprises a light-transmissive layer located between the light emitting element and the light-shielding layer.

15. The light emitting module according to claim 1, wherein the at least one first light source arrangement part is a through hole penetrating the light guide member in a thickness direction of the light guide member.

16. The light emitting module according to claim 1, wherein the at least one first light source arrangement part is a recess formed in a lower surface of the light guide member.

17. The light emitting module according to claim 1, further comprising: a light-transmissive member disposed in each of the at least one first light source arrangement part.

18. The light emitting module according to claim 1, wherein the at least one first light source is configured to emit light having a peak wavelength in a range of 400 nm to 530 nm.

19. The light emitting module according to claim 1, further comprising a light-reflecting sheet located below the light guide member, the light-reflecting sheet including a through-hole at a location overlapping with the at least one first light source in a top view.

20. A surface light source comprising:
the light emitting module according to claim 1; and
a wiring substrate;
wherein the light guide member is disposed on the wiring substrate, and the at least one first light source is mounted on the wiring substrate.

21. A surface light source comprising:
the light source module according to claim 3; and
a wiring substrate;
wherein the light guide member is disposed on the wiring substrate, and the at least one first light source and the at least one second light source are mounted on the wiring substrate.

* * * * *